(12) United States Patent
Basol et al.

(10) Patent No.: US 6,974,769 B2
(45) Date of Patent: Dec. 13, 2005

(54) CONDUCTIVE STRUCTURE FABRICATION PROCESS USING NOVEL LAYERED STRUCTURE AND CONDUCTIVE STRUCTURE FABRICATED THEREBY FOR USE IN MULTI-LEVEL METALLIZATION

(75) Inventors: Bulent Basol, Manhattan Beach, CA (US); Homayoun Talieh, San Jose, CA (US); Cyprian Uzoh, Milpitas, CA (US)

(73) Assignee: ASM NuTool, Inc., Fremont, CA (US)

( * ) Notice: Subject to any disclaimer, the term of this patent is extended or adjusted under 35 U.S.C. 154(b) by 0 days.

(21) Appl. No.: 10/663,318

(22) Filed: Sep. 16, 2003

(65) Prior Publication Data

US 2004/0052930 A1 Mar. 18, 2004

Related U.S. Application Data

(63) Continuation of application No. 09/642,827, filed on Aug. 22, 2000.

(60) Provisional application No. 60/200,002, filed on Apr. 27, 2000.

(51) Int. Cl.[7] .......................................... H01L 21/4763
(52) U.S. Cl. ..................................... 438/627; 438/645
(58) Field of Search ................................ 438/927, 618, 438/622, 643, 626–627, 665, 645–646, 687

(56) References Cited

U.S. PATENT DOCUMENTS

| | | | |
|---|---|---|---|
| 3,328,273 A | 6/1967 | Creutz et al. |
| 4,430,173 A | 2/1984 | Boudot et al. |
| 4,948,474 A | 8/1990 | Miljkovic |
| 4,954,142 A | 9/1990 | Carr et al. |
| 4,975,159 A | 12/1990 | Dahms |
| 5,084,071 A | 1/1992 | Nenadic et al. |
| 5,256,565 A | 10/1993 | Bernhardt et al. |
| 5,354,490 A | 10/1994 | Yu et al. |
| 5,516,412 A | 5/1996 | Andricacos et al. |

(Continued)

FOREIGN PATENT DOCUMENTS

WO PCT 98/27585 6/1998

(Continued)

OTHER PUBLICATIONS

James J. Kelly et al., "Leveling and Microstructural Effects of Additives for Copper Electrodeposition", Journal of the Electrochemical Society, 146 (7), 1999, pp. 2540-2545.

(Continued)

*Primary Examiner*—Long Pham
*Assistant Examiner*—Thao X. Le
(74) *Attorney, Agent, or Firm*—Knobbe Martens Olson & Bear LLP

(57) ABSTRACT

Conductive structures in features of an insulator layer on a substrate are fabricated by a particular process. In this process, a layer of conductive material is applied over the insulator layer so that the layer of conductive material covers field regions adjacent the features and fills in the features themselves. A grain size differential between the conductive material which covers the field regions and the conductive material which fills in the features is then established by annealing the layer of conductive material. Excess conductive material is then removed to uncover the field regions and leave the conductive structures. The layer of conductive material is applied so as to define a first layer thickness over the field regions and a second layer thickness in and over the features. These thicknesses are dimensioned such that $d_1 \leq 0.5 d_2$, with $d_1$ being the first layer thickness and $d_2$ being the second layer thickness. Preferably, the first and second layer thicknesses are dimensioned such that $d_1 \leq 0.3 d_2$.

15 Claims, 6 Drawing Sheets

U.S. PATENT DOCUMENTS

| | | | |
|---|---|---|---|
| 5,523,259 A * | 6/1996 | Merchant et al. ............ | 438/643 |
| 5,681,215 A | 10/1997 | Sherwood et al. | |
| 5,755,859 A | 5/1998 | Brusic et al. | |
| 5,762,544 A | 6/1998 | Zuniga et al. | |
| 5,770,095 A | 6/1998 | Sasaki et al. | |
| 5,773,364 A | 6/1998 | Farkas et al. | |
| 5,793,272 A | 8/1998 | Burghartz et al. | |
| 5,795,215 A | 8/1998 | Guthrie et al. | |
| 5,807,165 A | 9/1998 | Uzoh et al. | |
| 5,840,629 A | 11/1998 | Carpio | |
| 5,858,813 A | 1/1999 | Scherber et al. | |
| 5,884,990 A | 3/1999 | Burghartz et al. | |
| 5,897,375 A | 4/1999 | Watts et al. | |
| 5,911,619 A | 6/1999 | Uzoh et al. | |
| 5,922,091 A | 7/1999 | Tsai et al. | |
| 5,930,669 A | 7/1999 | Uzoh | |
| 5,933,753 A | 8/1999 | Simon et al. | |
| 5,954,997 A | 9/1999 | Kaufman et al. | |
| 5,985,123 A | 11/1999 | Koon | |
| 6,004,880 A | 12/1999 | Liu et al. | |
| 6,017,144 A * | 1/2000 | Guo et al. .................... | 700/121 |
| 6,027,631 A | 2/2000 | Broadbent | |
| 6,063,506 A | 5/2000 | Andricacos et al. | |
| 6,066,030 A | 5/2000 | Uzoh | |
| 6,074,544 A | 6/2000 | Reid et al. | |
| 6,103,085 A | 8/2000 | Woo et al. | |
| 6,136,163 A | 10/2000 | Cheung et al. | |
| 6,165,555 A * | 12/2000 | Jun et al. .................... | 427/252 |
| 6,176,992 B1 | 1/2001 | Talieh | |
| 6,191,027 B1 | 2/2001 | Omura | |
| 6,228,759 B1 * | 5/2001 | Wang et al. ................ | 438/625 |
| 6,297,154 B1 * | 10/2001 | Gross et al. ................ | 438/663 |
| 6,335,569 B1 | 1/2002 | Joshi ......................... | 257/750 |
| 6,340,633 B1 * | 1/2002 | Lopatin et al. ............. | 438/625 |
| 6,380,083 B1 * | 4/2002 | Gross ......................... | 438/687 |
| 6,391,774 B1 * | 5/2002 | Takewaki ................... | 438/687 |
| 6,409,904 B1 * | 6/2002 | Uzoh et al. ................. | 205/137 |
| 6,417,571 B1 * | 7/2002 | Nogami et al. ............. | 257/762 |
| 6,451,682 B1 * | 9/2002 | Fujikawa et al. ........... | 438/618 |
| 6,465,354 B1 * | 10/2002 | Sugai et al. ................ | 438/687 |
| 6,465,376 B2 * | 10/2002 | Uzoh et al. ................. | 438/627 |
| 6,471,913 B1 * | 10/2002 | Weaver et al. .............. | 266/256 |
| 6,478,935 B1 * | 11/2002 | Ueno ......................... | 204/237 |
| 6,508,920 B1 * | 1/2003 | Ritzdorf et al. ............. | 204/194 |

FOREIGN PATENT DOCUMENTS

WO      WO 00/26443      5/2000

OTHER PUBLICATIONS

Joseph M. Steigerwald et al., "Chemical Mechanical Planarization of Microelectronic Materials", A Wiley-Interscience Publication, 1997 by John Wiley & Sons, Inc. pp. 212-222.

Robert D. Mikkola et al., "Investigation of the Roles of the Additive Components for Second Generation Copper Electroplating Chemistries Used for Advanced Interconnect Metalization", 2000 IEEE, IEEE Electron Devices Society, pp. 117-119, Jun. 2000.

* cited by examiner

CONDUCTIVE STRUCTURE FABRICATION PROCESS USING NOVEL LAYERED STRUCTURE AND CONDUCTIVE STRUCTURE FABRICATED THEREBY FOR USE IN MULTI-LEVEL METALLIZATION

This is a continuation of U.S. Ser. No. 09/642,827 filed Aug. 22, 2000 claiming priority to Prov. No. 60/200,002 filed Apr. 27, 2000, incorporated herein by reference.

BACKGROUND OF THE INVENTION

Multi-level metallization is commonly used in the integrated circuit industry to interconnect various components of a circuit and a system. Metals or metal alloys, such as copper or copper alloys, are used in these structures due to their low resistivity. FIGS. 1(a)–1(c) show an example of the fabrication of two parallel metal lines or other conductive structures in an insulator layer (oxide) 50 grown on a substrate. In this example, copper (Cu) is used as the conductor.

First, a barrier layer 52 and a seed layer 54 are deposited over the whole structure as shown in FIG. 1(a). A layer 100 of Cu is then deposited as shown in FIG. 1(b), by a technique such as electroplating, over the seed layer. The barrier layer, which remains, is not shown in FIG. 1(b). An etching, electrochemical etching, or chemical mechanical polishing (CMP) process is then carried out to remove the copper from the field regions 58 and leave it in the channels or other types of features 56 formed in the insulator layer as shown in FIG. 1(c).

The process of FIGS. 1(a)–1(c) depicts an ideal situation. In practice, it is extremely difficult to obtain the structure of FIG. 1c. FIG. 2 shows the actual cross section of a structure that one may get. Defects, such as dishing 60 and copper remnants 62, can be observed in the channels or other features 56 and over the field regions 58, respectively. Dishing presents a problem because it produces a non-planar surface and increases the resistance of the line. Copper remnants can cause shorts between conductive lines. These defects can be caused by the CMP process (incomplete removal from the field regions and too much removal from the features or channels) as well as by the etching process or the electroetching process.

FIG. 3(a) is a view similar to FIG. 1(b) but is somewhat enlarged and shows the barrier layer 52, which is not shown in FIG. 1(b). FIG. 3(a) also shows only one channel or other type of feature 56 and two adjacent field regions 58. Feature or channel dimensions can vary widely, but in order to roughly illustrate the scale of the illustrations provided by FIGS. 3(a)–3(d), it will be assumed that the feature width W in FIG. 3(a) is 100 μm and the feature depth D is 6 μm. FIG. 3(a) also illustrates, schematically, the small-grained structure of the Cu layer 100 deposited over the barrier layer 52 on the insulator layer 50.

Conventionally, after the Cu layer 100 has been deposited on the barrier layer overlying the insulator layer 50 as shown in FIG. 3(a), the Cu layer is annealed so as to enlarge its grain structure. FIG. 3(b) illustrates, schematically, the relatively large-grained structure of the Cu layer 100 after annealing.

The etching, electrochemical etching, or CMP process carried out to remove Cu from the field regions 58 is conventionally performed after the annealing operation. FIG. 3(c) shows the structure of the copper layer 100 after the layer has been partially removed from over the field regions 58 by the etching, electroetching, or CMP process.

FIG. 3(d) shows the insulator layer and barrier layer structure, with a copper conductive structure remaining in the line, i.e. the channel or other type of feature 56, after the copper layer has been completely removed from the field regions 58 by the selected process. FIG. 3(d) also shows dishing 60 in the copper conductive structure left in the channel or other feature 56 which results from the conventional copper deposition, annealing and copper removal process.

SUMMARY OF THE INVENTION

The present invention proposes an approach to overcome the dishing and copper (or other conductor) remnant problems mentioned by establishing a structural difference between conductor layers in different regions on the substrate surface. More specifically, the present invention relates to a particular process for fabricating conductive structures in features of an insulator layer on a substrate, to a layered structure used in such a process, and to conductive structures produced by the process. According to the process, a layer of conductive material is applied over the insulator layer so that the layer of conductive material covers field regions adjacent the features and fills in the features. A grain size differential between the conductive material which covers the field regions and the conductive material which fills in the features is then established by annealing the layer of conductive material, and excess conductive material is removed to uncover the field regions and leave the conductive structures.

The layer of conductive material is applied so as to define a first layer thickness over the field regions and a second layer thickness in and over the features. The first layer thickness and the second layer thicknesses are dimensioned such that $d_1 \leq 0.5 d_2$, with $d_1$ being the first layer thickness and $d_2$ being the second layer thickness. Preferably, the first and second layer thicknesses are dimensioned such that $d_1 \leq 0.3 d_2$.

According to one embodiment of the invention, the layer of conductive material over the insulator layer is applied by depositing the layer of conductive material over the insulator layer, and partially removing the layer of conductive material from over the field regions to establish a desired thickness differential between the first and second layer thicknesses. According to another embodiment of the invention, the layer of conductive material over the insulator layer is applied by depositing a planarized layer of conductive material over the insulator layer to establish a desired thickness differential between the first and second layer thicknesses.

The layered structure is used in the process and includes the insulator layer on the substrate as well as the layer of conductive material covering the field regions and filling in the features. A grain size differential between the conductive material which covers the field regions and the conductive material which fills in the features is established in the conductive material layer by annealing.

DESCRIPTION OF THE PREFERRED EMBODIMENTS

Figure 3B:
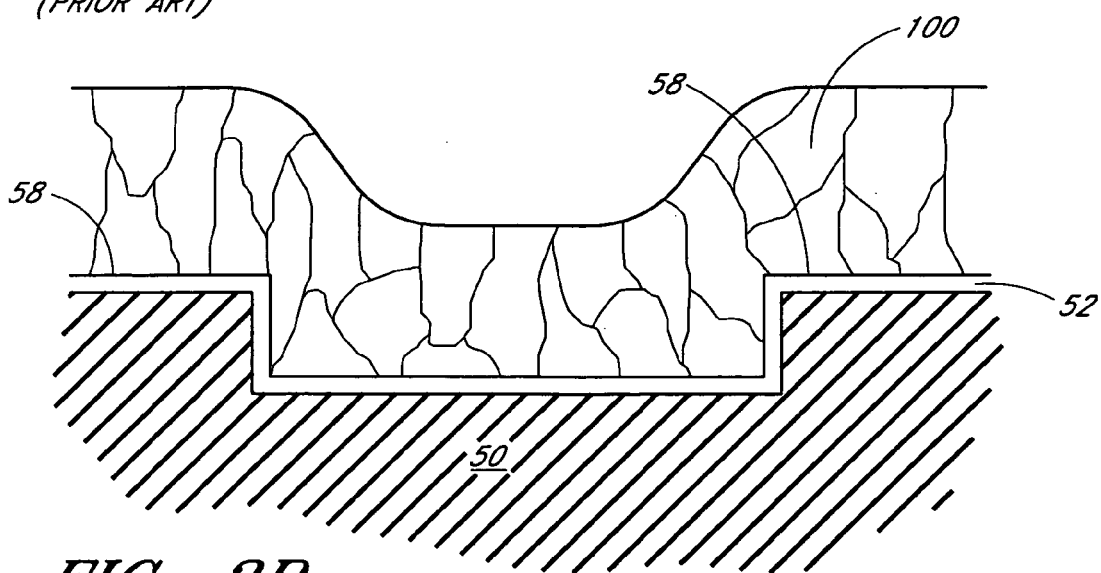
FIG. 3(b) is a view similar to FIG. 3(a) but showing the large grain structure of the deposited Cu layer following an annealing operation which conventionally takes place between Cu deposition and removal of Cu from over the field regions.
Figure 3C:
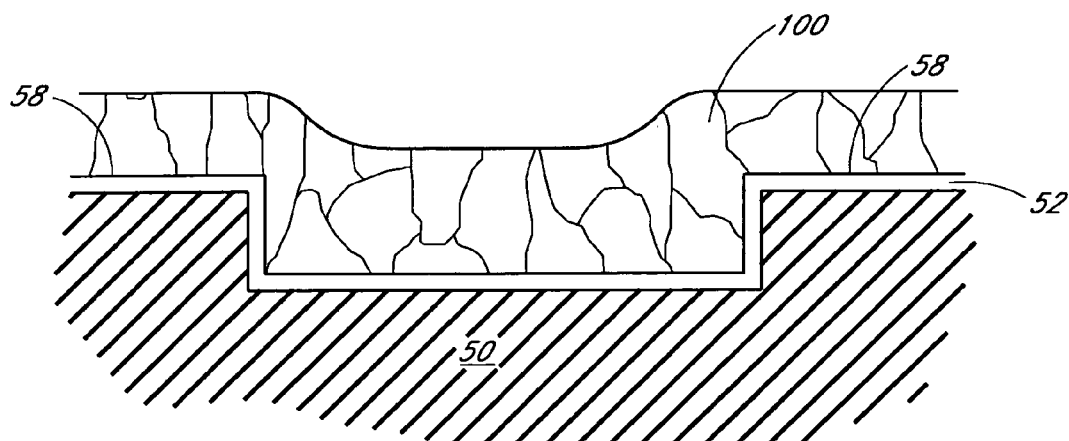
FIG. 3(c) is a view similar to FIG. 3(b) but showing the annealed Cu layer after it has been partially removed from over the field regions.
Figure 3D:
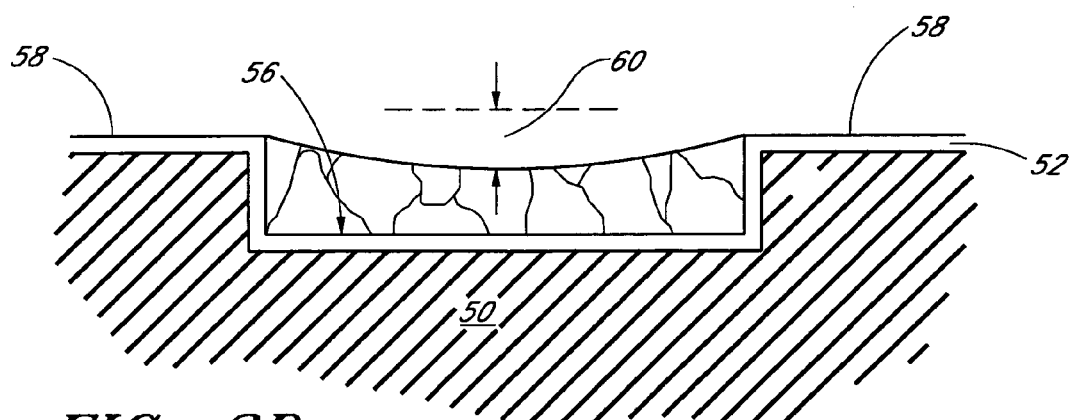
FIG. 3(d) is a view similar to FIG. 3(c) showing a dishing defect in the Cu remaining in an insulator layer channel or other feature after Cu has been completely removed from the field regions according to a conventional process.
Figure 4:
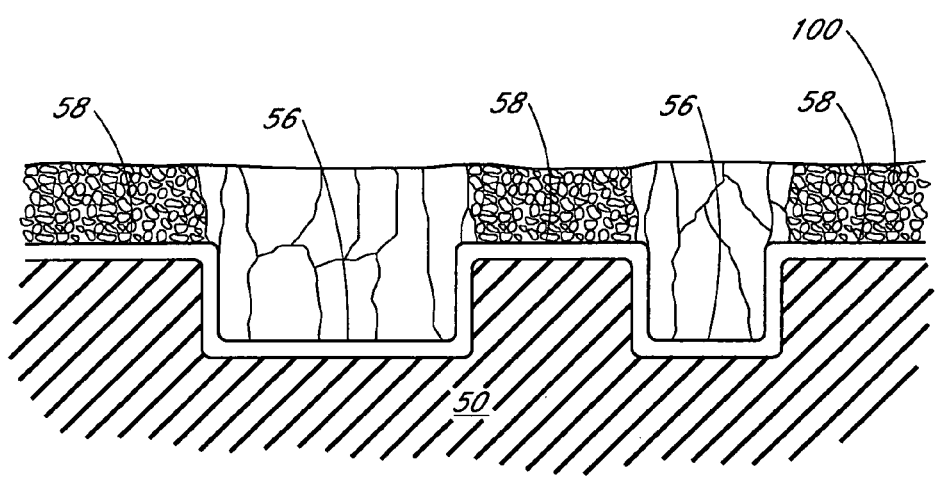
FIG. 4 is a partial cross-sectional view of a layered structure, similar to FIG. 1(b), showing a Cu layer according to the invention, after annealing, with large grain structure in certain regions and small grain structure in other regions.

FIG. 4 represents a novel conductive material layer deposited over a patterned insulator structure. The barrier layer 52 remains disposed between the deposited material, which will be presumed to be Cu, and the insulator layer 50. The novel conductive material layer shown in FIG. 4 is distinguished from the conductive material layer shown in FIG. 3(b) in that the novel layer includes built in differences in both chemical properties (corrosion rate, etching rate, reactivity, etc.) and structure (grain size, crystal orientation, porosity/density, etc.). More specifically, the chemical properties and structure of the Cu in and over the channels or various other types of features 56 (hereafter referred to generally as "features") are different from the chemical properties and structure of the Cu over the field regions 58. Over the field regions 58, the Cu deposits have small grains and possibly low density. In and over the features, on the other hand, the Cu deposits are dense and display large grain structures.

Figure 1A:
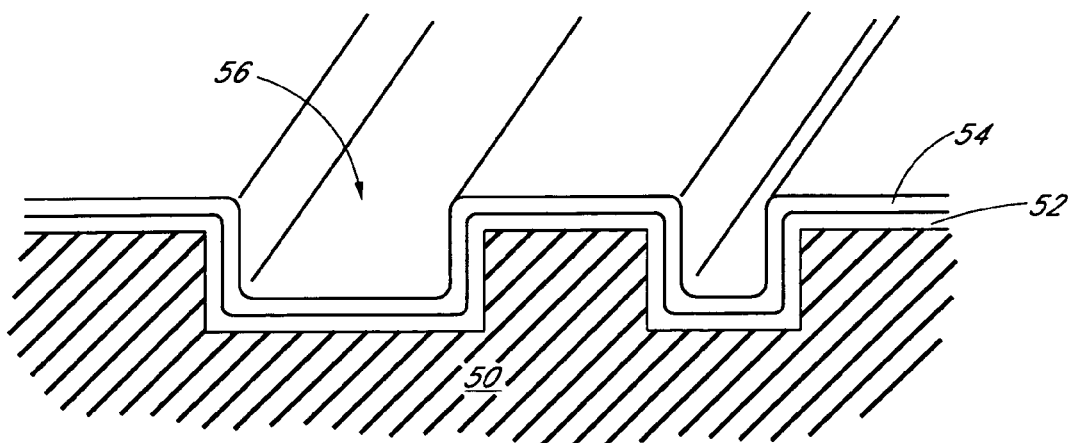
FIG. 1(a) is a partial cross-sectional view of a patterned insulator layer grown on a substrate surface and having overlying barrier and seed layers.
Figure 1B:
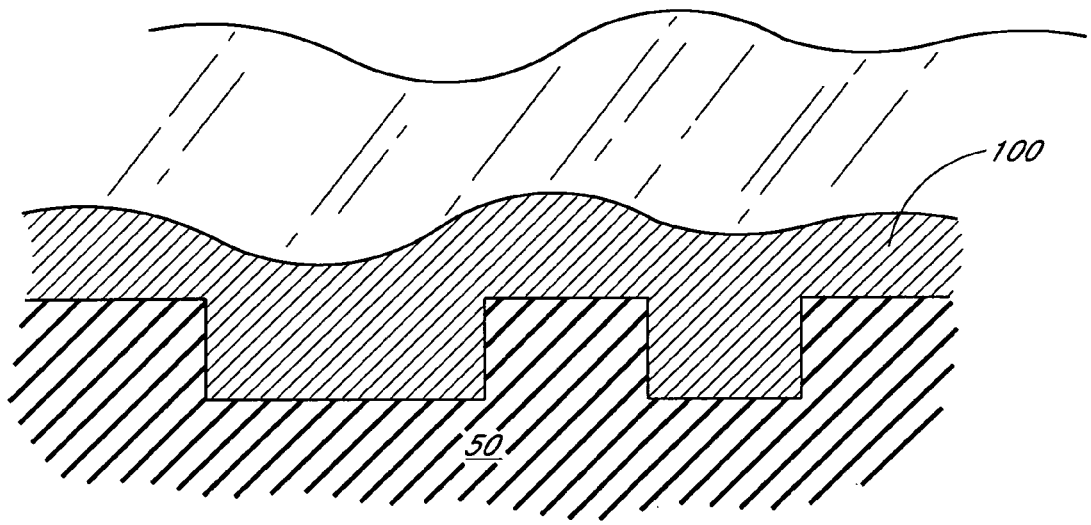
FIG. 1(b) is a view similar to FIG. 1(a) showing the insulator layer and Cu layer structure after copper deposition but prior to removal of Cu from over the field regions.
Figure 1C:
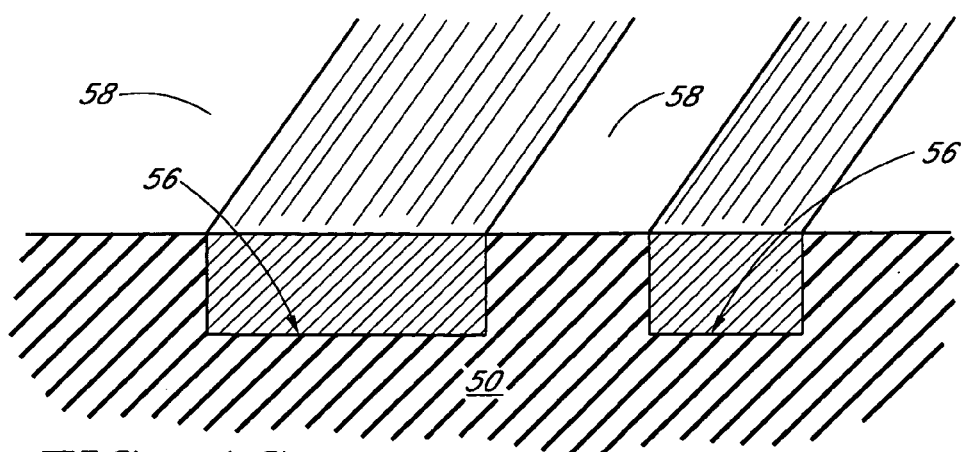
FIG. 1(c) is a view similar to FIG. 1(b) but showing an ideal structure after Cu has been removed from over the field regions.
Figure 2:
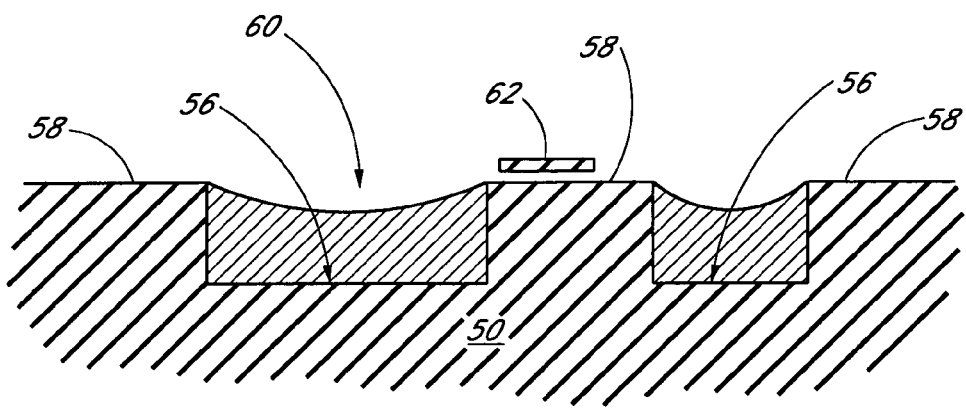
FIG. 2 is an illustration of defects which may occur when a conventional copper deposition, annealing, and copper removal process is carried out.

When the copper layer of FIG. 4 is subjected to an etching, electrochemical etching, or CMP process, it is possible to adjust the process parameters such that the material over the field regions 58 is removed at a rate which is different from the rate at which the material in and over the features 56 is removed. In other words, the differential built in the film in terms of its structure is translated into a differential in the material removal rate. For example, when the film of FIG. 4 is subjected to an appropriately selected CMP step, the chemical removal rate of the small grain regions will be higher than that of the large grain regions. Therefore, the material over the field regions 58 should be cleaned up first, decreasing and/or eliminating the Cu remnant defects shown in FIG. 2. Similarly, since the removal rate of material over the features 56 will be smaller, dishing should also be minimized. The same arguments can also be made for etching and electroetching processes, since small grain materials can generally be etched faster in a given etchant. The important concept here is to build a structural difference in material deposited over the field regions and in and over the features of the substrate so that this structural difference can be translated into a difference between the chemical/mechanical removal rates of two types of material.

One way of obtaining the structure of FIG. 4 is to initially deposit the Cu film in a planar manner so that its thickness is larger over the features and smaller over the field regions. In this way, upon annealing, a differential in grain size can be obtained.

Figure 5:
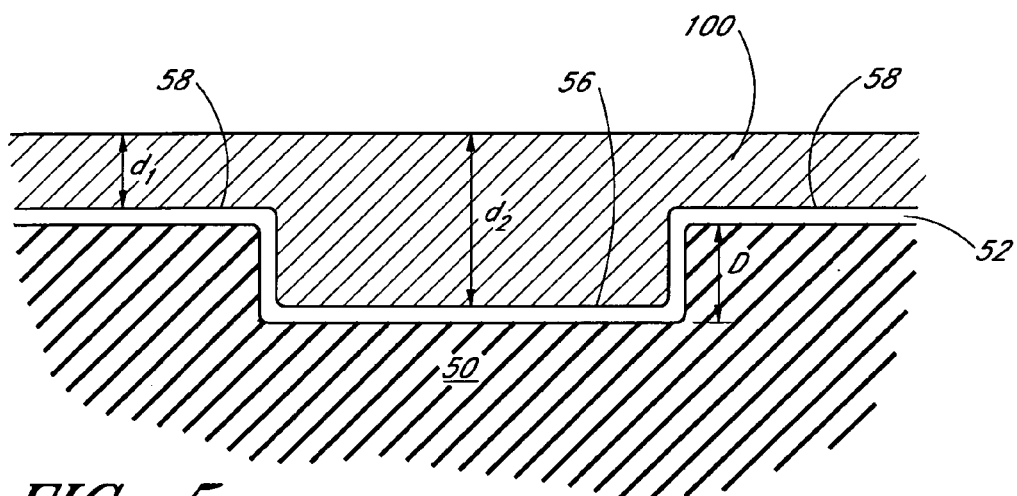
FIG. 5 is a cross-sectional view of a planarized, un-annealed Cu film according to a first embodiment of the invention.

FIG. 5 is a cross-sectional view of a patterned insulator layer 50 on which an un-annealed, planarized, copper conductor layer or film 100 has been deposited. One feature 56 is shown. The barrier layer 52 remains between the planarized copper conductor layer 100 and the insulator layer 50.

The un-annealed, planarized layer 100 shown in FIG. 5 may be obtained in the manner disclosed by commonly assigned U.S. patent application Ser. No. 09/201,929, titled METHOD AND APPARATUS FOR ELECTRO CHEMICAL MECHANICAL DEPOSITION, filed Dec. 1, 1998, the disclosure of which is incorporated by reference herein. Other commonly assigned U.S. patent applications also exist that relate to depositing a Cu film on a substrate and then planarizing the deposited film. Attention is directed to U.S. application Ser. No. 09/283,024, titled METHOD AND APPARATUS FOR FORMING AN ELECTRICAL CONTACT WITH A SEMICONDUCTOR SUBSTRATE, filed Mar. 30, 1999; Ser. No. 09/285,621, titled METHOD AND APPARATUS FOR PLATING AND POLISHING A SEMICONDUCTOR SUBSTRATE, filed Apr. 3, 1999; Ser. No. 09/373,681, titled METHOD AND APPARATUS FOR DEPOSITING AND CONTROLLING THE TEXTURE OF A THIN FILM, filed Aug. 13, 1999; Ser. No. 09/398,258, titled NOVEL CHIP INTERCONNECT AND PACKAGING DEPOSITION METHODS AND STRUCTURES, filed Sep. 17, 1999; and Ser. No. 09/483,095, titled SEMICONDUCTOR WORKPIECE PROXIMITY PLATING METHODS AND APPARATUS, filed Jan. 14, 2000.

Other commonly assigned U.S. applications which may be of interest include Ser. No. 09/466,014, titled A VERTICALLY CONFIGURED CHAMBER USED FOR MULTIPLE PROCESS; Ser. No. 09/472,523, titled WORK PIECE CARRIER HEAD FOR PLATING AND POLISHING, filed Dec. 27, 1999; Ser. No. 09/511,278, titled PAD DESIGNS AND STRUCTURES FOR A VERSATILE MATERIALS PROCESSING APPARATUS, filed Feb. 23, 2000; Ser. No. 09/544,558, titled MODIFIED PLATING SOLUTION FOR PLATING AND PLANARIZATION AND PROCESS UTILIZING SAME, filed Apr. 6, 2000; Ser. No. 09/568,584, titled ANODE ASSEMBLY FOR PLATING AND PLANARIZING A CONDUCTIVE LAYER, filed May 11, 2000; and Ser. No. 09/621,969, titled PAD DESIGNS AND STRUCTURES WITH IMPROVED FLUID DISTRIBUTION, filed Jul. 21, 2000.

It has been found that the particularly desired grain structures represented in FIG. 4 will result from annealing the Cu film when the thickness of the deposited Cu film over the field regions and the thickness of the film in and over the features have a certain relationship. Specifically, referring now to FIG. 5, the desired grain structures will result when the Cu film thickness $d_1$ over the field regions 58 and the Cu film thickness $d_2$ in and over the features are dimensioned such that $d_1 \leq 0.5 d_2$. Most preferably, the thicknesses are dimensioned such that $d_1 \leq 0.3 d_2$.

Once an un-annealed, planarized, copper conductor layer or film 100 as shown in FIG. 5 has been deposited over the patterned insulator and its barrier layer, the film 100 is then annealed to establish the grain size differential.

Annealing is performed to enlarge the Cu grains in the features 56 so that the grains become as large as possible and voids are eliminated. Annealing parameters (times and temperatures) can be readily determined by one of ordinary skill in the art of metallurgy. A feature depth D of about 6 μm will be presumed by way of example. It will also be assumed that sufficient un-annealed, planarized, copper conductor film 100 has been deposited so that $d_1$ in FIG. 5 is roughly 3 μm and $d_2$ in FIG. 5 is roughly 9 μm. It is to be understood that these dimensions are mentioned as examples only and are not intended to limit the invention in any way. Smaller or larger feature depths D and deposition thicknesses $d_1$ and $d_2$ can readily be present. Within this framework, numerous annealing processes are acceptable. Certain examples of annealing processes will be mentioned, but the annealing temperatures and annealing times specified are not to be considered limiting.

Assuming again that copper is the conductor deposited on the patterned insulator, annealing can be performed over temperatures ranging, for example, from about 85° C. to about 250° C. These temperatures are not to be considered limiting. Air may be used as an ambient atmosphere when annealing is performed in a temperature range of about 85° C.–110° C. In this temperature range, annealing can be performed for one hour or more. At higher temperatures, up to about 250° C., annealing will commonly be performed in an inert or reducing atmosphere to avoid oxidation. At temperatures of about 200° C.–250° C., annealing can be performed for shorter times of, for example, 1–5 minutes. These times are not to be considered limiting. In the range of temperatures between about 110° C. and 200° C., again, annealing will commonly be performed in an inert or reducing atmosphere. As an example, at a temperature of about 150° C., the copper film 100 could be annealed for approximately one-half hour. Annealing times, however, will depend on the copper conductor film thickness and can be determined by one of ordinary skill in the art of metallurgy without undue experimentation.

After annealing, with the Cu film thicknesses $d_1$ and $d_2$ having the relationship mentioned above, the grain structure represented in FIG. 4 results. Excess annealed copper is then removed by etching, electroetching, or CMP from over the features and over the field regions 58 as will be described.

Various well known chemical compositions are used as etchants and electroetchants for different types of metal films. These compositions are well known to those of ordinary skill in the art of metallurgy. As examples of these well known compositions, for copper, solutions of $H_2SO_4$ (sulphuric acid) and $H_2O_2$ (hydrogen peroxide) are commonly used as etchants, while, typically, milder acids, such as $H_3PO_4$ (phosphoric acid), are used as electroetching solutions. Various etching and electroetching compositions and processes are discussed, for example, in *Etching Compositions and Processes*, M. J. Collie, Noyes Data Corporation, 1982, p. 3.

The annealed Cu grain size over the field regions 58 (typically less than 0.5 μm diameter, average) is substantially smaller than the annealed Cu grain size in and over the features 56 (typically up to and sometimes exceeding 5 μm, average), which is a function of the depth of the features. The density of the annealed Cu over the field regions 58, due to voids and other defects, may be in the 97%–100% range, while the corresponding density of the annealed Cu in and over the features 56 is ideally at 100% and, in reality, will be just about 100%. Although this density differential could improve removal properties, it is more important to have present the differential in grain size represented in FIG. 4.

Small grain material has a larger concentration of grain boundaries than large grain material. Grain boundaries are "defective" regions as compared to the bulk of the grain, and are where etching or electroetching occurs. Etchants can be formulated to attack grain boundaries, and the rate of chemical attack or chemical etching for small grain material will be higher than that for large grain material. The same can be said for the rate of electroetching, since the same sort of material removal mechanism is present. Thus, in the example discussed above, excess annealed Cu will be removed, by etching or electroetching, from over the field regions 58 before it is removed from over the features 56.

Removal of excess annealed Cu can also be accomplished by CMP. The removal of any material by CMP, however, involves (1) a chemical reaction component, and (2) a mechanical material removal component. In a CMP material process, if the mechanical component of the process is doing most of the material removal, then small grain regions of material can actually have a lower removal rate than that of large grain regions. By contrast, if the chemical component of the CMP process is more dominant, then large grain regions of material will have the lower removal rate. Consequently, in the present application of CMP to remove excess Cu from over the channels 56 and the field regions 58, the CMP process will have to be adjusted so that the chemical component is strong and the small grain regions are removed faster than the large grain regions. Such an adjustment may be performed, for example, by using a relatively reactive chemical composition in the CMP process.

Figure 8:
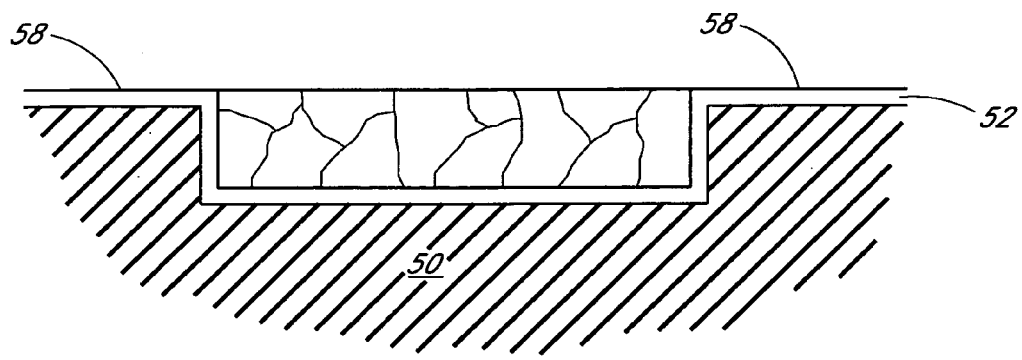
FIG. 8 is a cross-sectional view, similar to FIG. 1(c), showing an improved conductive structure, barrier layer, and insulator layer structure, without dishing or conductor remnants, which can be obtained by the invention.

Through the use of etching, electroetching, or a properly selected CMP step, as described, on the grain structure represented in FIG. 4, the small grain Cu over the field regions 58 can be removed more quickly than the large grain Cu in and over the features 56, and the structure shown in FIG. 8, without dishing or copper remnants, can be obtained.

Figure 3A:
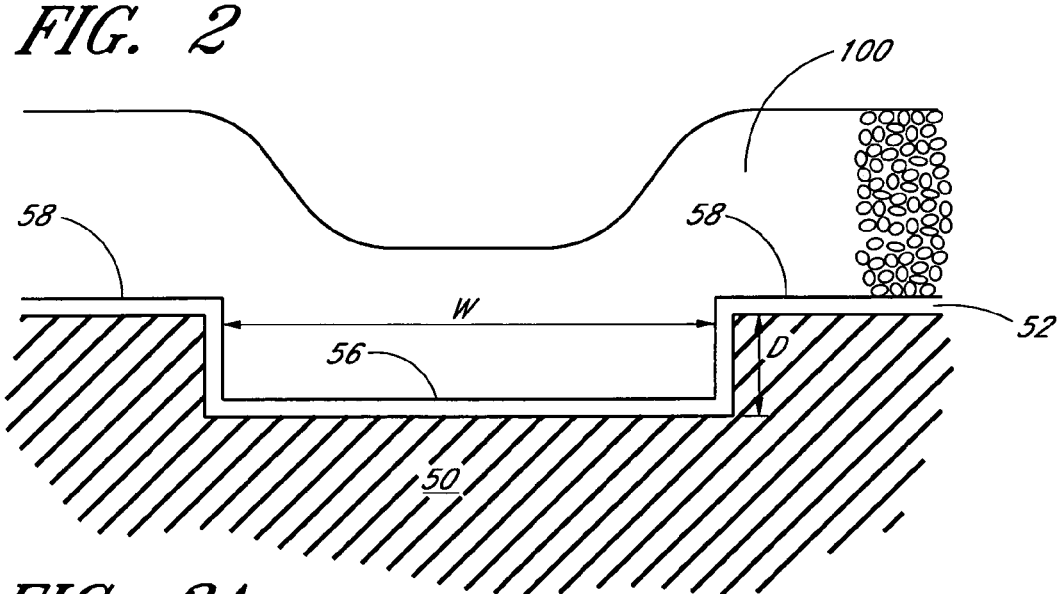
FIG. 3(a) is a somewhat enlarged view similar to FIG. 1(b) showing the small grain structure of the Cu layer as deposited.

An alternative way to obtain the structure of FIG. 8 is to start with an un-annealed conductive material film deposited in a conventional, non-planar manner as shown in FIG. 3(a) and then perform, in order, partial polishing, annealing, and additional polishing operations. This alternative way will be described with reference to FIGS. 6 and 7(a)–7(c). The conductive material will again be presumed to be Cu.

Figure 6:
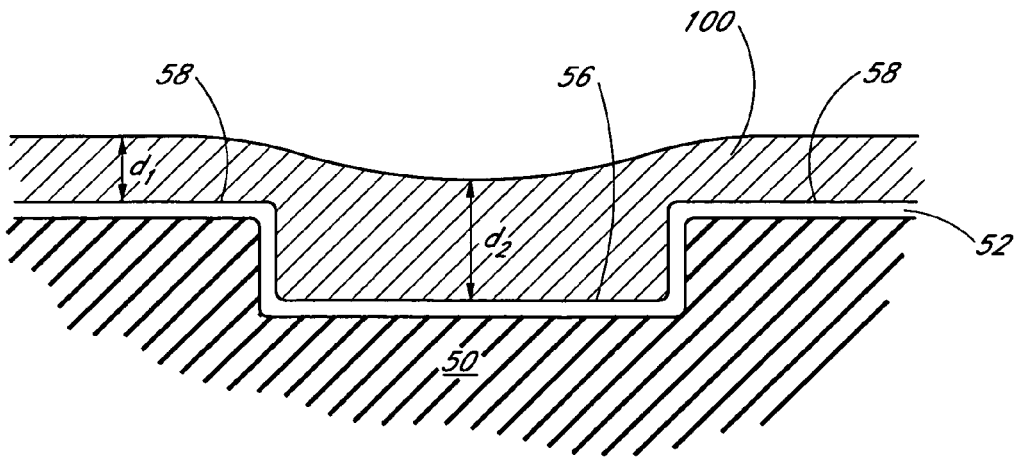
FIG. 6 is a cross-sectional view similar to FIG. 5 but of a partially polished, un-annealed Cu film according to a second embodiment of the invention.

FIG. 6 is a cross sectional view similar to FIG. 5. However, as opposed to FIG. 5, which shows a planarized, un-annealed film, FIG. 6 shows a partially polished, un-annealed Cu film 100. The structure in FIG. 6 corresponds to that shown in FIG. 7(b).

Figure 7A:
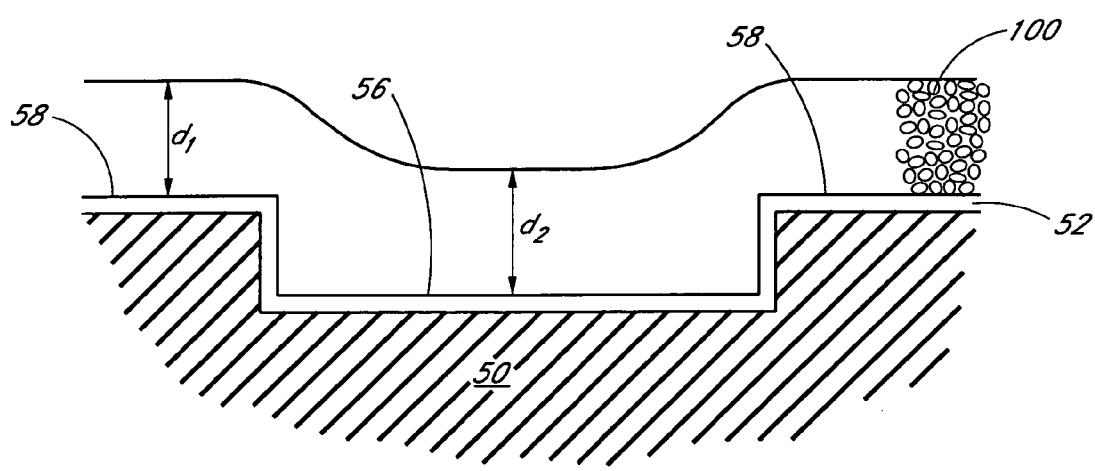
FIGS. 7(a)–7(c) illustrate sequential operations forming part of an inventive process including use of the Cu film shown in FIG. 6.
Figure 7B:
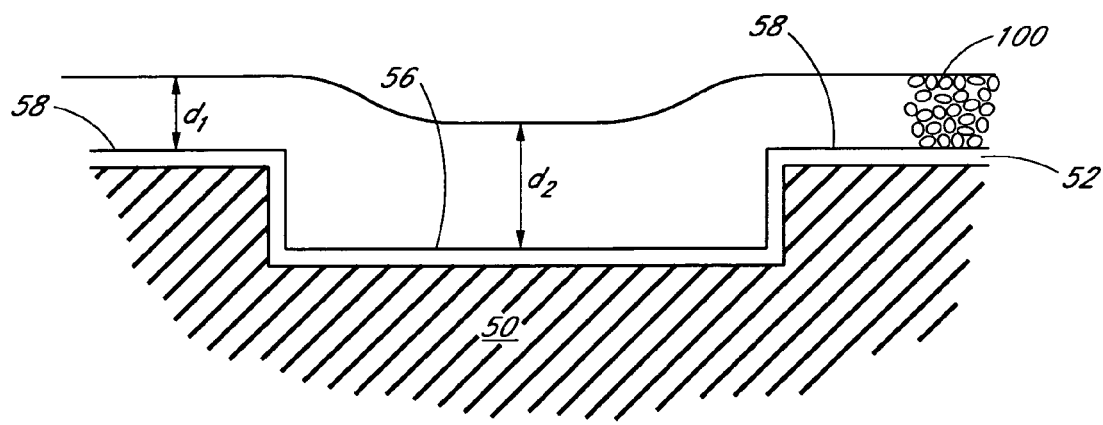

FIG. 7(a) shows a patterned insulator layer 50, a barrier layer 52, and a layer 100 of small grain Cu. As in the known process of FIGS. 3(a)–3(d), the layer 100 of Cu is deposited, by a technique such as electroplating, over a seed layer originally present on the barrier layer 52, to obtain the structure shown in FIG. 7(a). As deposited, $d_1$ is approximately equal to $d_2$. At this point, instead of proceeding directly to an annealing step as in the known process represented in FIGS. 3(a)–3(d), a partial polishing operation is performed to reduce $d_1$ and thereby modify the dimensional relationship of $d_1$ and $d_2$. It is to be understood that, although a "partial polishing" operation has been referred to, any desired material removal process, such as CMP, etching, or electroetching, could be used. Sufficient small grained Cu is removed, by way of the partial polishing operation, from over the field regions 58 so that $d_1 \leq 0.5d_2$. Most preferably, the thicknesses are dimensioned such that $d_1 \leq 0.3d_2$.

Figure 7C:
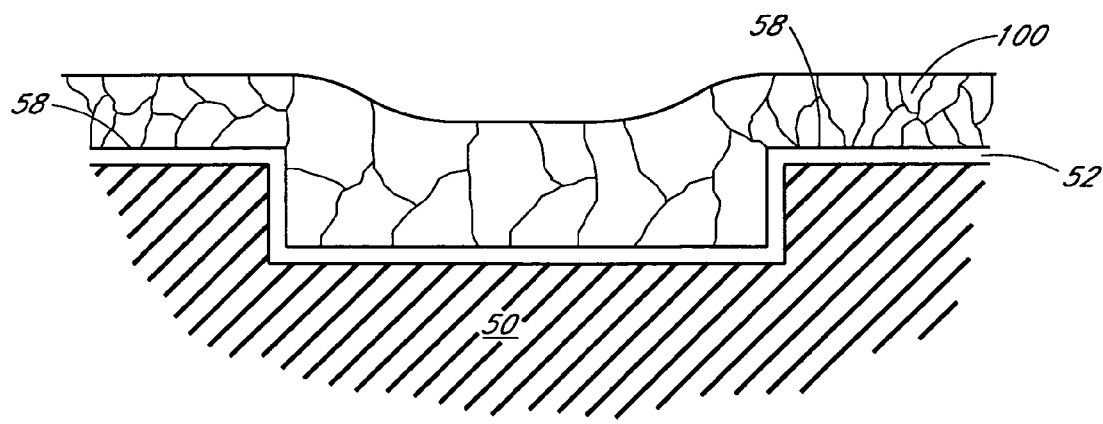

After a sufficient amount of Cu has been removed from over the field regions to bring the thickness $d_1$ and $d_2$ into the desired relationship, the small grained Cu is annealed. Annealing produces a differential in grain size, represented in the layered structure shown in FIG. 7(c), such that after annealing, the Cu grains in and over the features 56 are larger than the Cu grains over the field regions 58. In this sense, the grain structure shown in FIG. 7(c) is similar to that shown in FIG. 4. The small grain Cu over the field regions, therefore, can be removed more quickly than the large grain Cu in and over the features 56, as explained earlier, by an etching, an electroetching, or an appropriate CMP operation. The structure shown in FIG. 8, without dishing or copper remnants, can be obtained during this final material removal operation.

Figure 9:
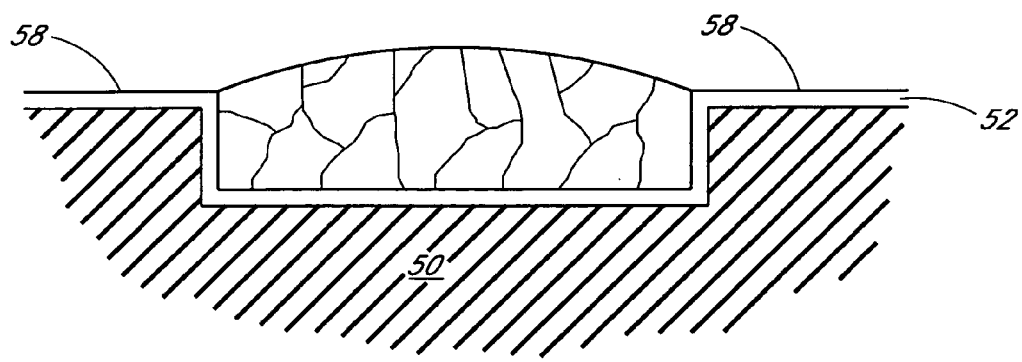
FIG. 9 is a cross-sectional view similar to FIG. 8 but showing a conductive structure extending beyond adjacent field regions.

If certain parameters, such as etchant strength, are adjusted in the particular material removal process utilized, then other configurations can be obtained. The cross-sectional view of FIG. 9, for example, shows a Cu or other type of conductive structure which actually extends beyond adjacent field regions 58.

Although the invention has been described in connection with the use of depositing Cu, it is similarly applicable to other conductors (metals and conductive metal alloys) which can be electroplated over a semiconductor substrate. The invention is applicable, for example, to depositing Ni, Au, Pt, Ag, Pd, or Rh on such a substrate.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

We claim:

1. A process of fabricating conductive structures in features of an insulator layer on a substrate comprising:
    applying a layer of conductive material over the insulator layer so that the layer of conductive material covers field regions adjacent said features and fills in said features;
    annealing the layer of conductive material to establish a grain size differential between the conductive material which covers the field regions and the conductive material which fills in the features by forming small grains in the conductive material covering the field regions and large gains in the conductive material over and filling the features, and
    removing the conductive material with small grains faster than the conductive material with large grains.

2. The process according to claim 1, wherein the layer of conductive material is applied so as to define a first layer thickness over the field regions and a second layer thickness in and over the features.

3. The process according to claim 2, wherein the first layer thickness and the second layer thickness are dimensioned such that $d_1 \leq 0.5d_2$, with $d_1$ being the first layer thickness and $d_2$ being the second layer thickness.

4. The process according to claim 3, wherein the first and the second layer thicknesses are dimensioned such that $d_1 \leq 0.3d_2$.

5. The process according to claim 2, wherein applying the layer of conductive material over the insulator layer includes depositing the layer of conductive material over the insulator layer, and partially removing the layer of conductive material from over the field regions to establish a desired thickness differential between the first and second layer thicknesses.

6. The process according to claim 2, wherein applying the layer of conductive material over the insulator layer includes depositing a planarized layer of conductive material over the insulator layer to establish a desired thickness differential between said first and second layer thicknesses.

7. The process according to claim 5, wherein the first layer thickness and the second layer thickness are dimensioned such that $d_1 \leq 0.5d_2$, with $d_1$ being the first layer thickness and $d_2$ being the second layer thickness.

8. The process according to claim 7, wherein the first and the second layer thicknesses are dimensioned such that $d_1 \leq 0.3d_2$.

9. The process according to claim 6, wherein the first layer thickness and the second layer thickness are dimensioned such that $d_1 \leq 0.5d_2$, with $d_1$ being the first layer thickness and $d_2$ being the second layer thickness.

10. The process according to claim 9, wherein the first and the second layer thicknesses are dimensioned such that $d_1 \leq 0.3d_2$.

11. The process according to claim 1, wherein the conductive material is copper.

12. The process according to claim 1, wherein the conductive material is a copper alloy.

13. The process according to claim 1, wherein removing the excess conductive material is done by chemical mechanical polishing, chemical etching, electrochemical etching, or any combination of chemical mechanical polishing, chemical etching and electrochemical etching.

14. The process according to claim 1, wherein establishing the grain size differential also establishes a differential in chemical removal rates, physical removal rates, or both chemical and physical removal rates at which the excess conductive material can be removed from over the field regions and over the features.

15. The process according to claim 1, where removing comprised chemical mechanical polishing having a chemical component dominant over a physical component.

* * * * *